(12) United States Patent
Sherman

(10) Patent No.: US 7,795,568 B2
(45) Date of Patent: Sep. 14, 2010

(54) SOLAR TRACKING FOR TERRESTRIAL SOLAR ARRAYS

(75) Inventor: James Sherman, Hillsborough, NJ (US)

(73) Assignee: Emcore Solar Power, Inc., Albuquerque, NM (US)

( * ) Notice: Subject to any disclaimer, the term of this patent is extended or adjusted under 35 U.S.C. 154(b) by 41 days.

(21) Appl. No.: 12/258,253

(22) Filed: Oct. 24, 2008

(65) Prior Publication Data

US 2010/0102201 A1    Apr. 29, 2010

(51) Int. Cl.
*G01C 21/02* (2006.01)
(52) U.S. Cl. .................. 250/203.4; 250/203.1
(58) Field of Classification Search .............. 250/201.3, 250/203.3, 203.4, 216; 136/246–291
See application file for complete search history.

(56) References Cited

U.S. PATENT DOCUMENTS

| | | | |
|---|---|---|---|
| 4,031,385 A | 6/1977 | Zerlaut et al. | |
| 4,172,739 A | 10/1979 | Tassen | |
| 4,345,582 A | 8/1982 | Aharon | |
| 4,425,904 A | 1/1984 | Butler | |
| 4,585,318 A | 4/1986 | Seifert | |
| 5,600,124 A | 2/1997 | Berger | |
| 5,798,517 A | 8/1998 | Berger | |
| 6,058,930 A | 5/2000 | Shingleton | |
| 6,123,067 A | 9/2000 | Warrick | |
| 6,465,725 B1 | 10/2002 | Shibata et al. | |
| 6,960,717 B2 | 11/2005 | Stuart et al. | |
| 7,252,084 B2 | 8/2007 | Pawlenko et al. | |
| 7,381,886 B1 | 6/2008 | Aiken et al. | |
| 2009/0032014 A1* | 2/2009 | Meydbray ................. 126/608 |

FOREIGN PATENT DOCUMENTS

| | | | |
|---|---|---|---|
| JP | 2000196127 | | 7/2000 |
| JP | 2000223730 | | 8/2000 |
| JP | 2002202817 A | * | 7/2002 |
| WO | 2008/008023 A1 | | 1/2008 |

* cited by examiner

*Primary Examiner*—Tony Ko

(57) ABSTRACT

An automated method causes a terrestrial solar cell array to track the sun. The solar cell system includes motors that adjust a position of the array along different respective axes with respect to the sun, wherein a first motor adjusts the inclination angle of the array relative to the surface of the earth and a second motor rotates the array about an axis substantially perpendicular to that surface. The method includes (a) using a software algorithm to predict a position of the sun at a future time; (b) using a computer model to determine respective positions for the motors corresponding to the solar cell array being substantially aligned with the sun at the future time; and (c) activating and operating the motors at respective particular speeds so that at the future time the solar cell array is substantially aligned with the sun.

20 Claims, 9 Drawing Sheets

SOLAR TRACKING FOR TERRESTRIAL SOLAR ARRAYS

CROSS-REFERENCE TO RELATED APPLICATIONS

This disclosure is related to co-owned U.S. Pat. No. 7,381,886; patent application Ser. No. 12/024,489 filed on Feb. 1, 2008; and patent application Ser. No. 12/131,556 filed on Jun. 2, 2008.

TECHNICAL FIELD

This disclosure relates to solar tracking for terrestrial solar cell arrays.

BACKGROUND

This disclosure relates generally to solar tracking for use with one or more terrestrial solar cell arrays that convert sunlight into electrical energy. Accurate solar tracking is necessary because the amount of power generated by a given solar cell is related to the amount of sunlight that impinges on it. In an array, therefore, it is advantageous to optimize the amount of sunlight that impinges on each constituent solar cell. One difficulty, however, arises from the fact that the sun is continuously moving.

SUMMARY

Various aspects of the invention are set forth in the claims.

The details of one or more implementations are set forth in the accompanying drawings and the description below. Various features and advantages will be apparent from the description and drawings, and from the claims.

DETAILED DESCRIPTION

Overview

Figure 1A:
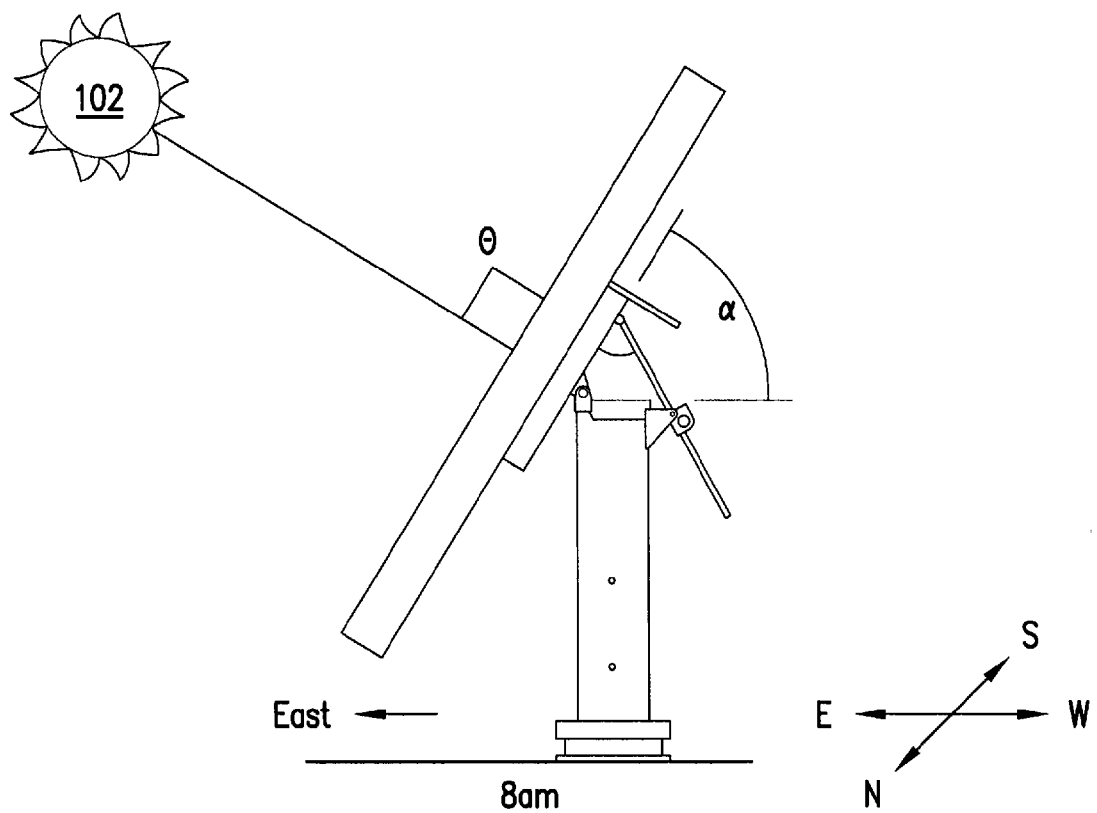
FIGS. 1A, 1B, 1C and 1D are an illustration of a solar cell array tracking the sun during different times of the day.

A terrestrial solar power system converts sunlight into electrical energy utilizing, e.g., multiple mounted arrays spaced in a grid over the ground. The array of solar cells has a particular optical size and is mounted for unitary movement on a cross-arm of a vertical support that tracks the sun. The array can include subarrays, sections, modules and/or panels.

The amount of power generated by the array is directly related to the amount of sunlight impinging upon the constituent solar cells. It is highly advantageous, therefore, to orient the array such that the plane of the array (of lenses and solar cells) is orthogonal to the incoming rays of the sun, and the power generation is maximized. To that end, a solar tracking mechanism is employed that ensures that the plane of concentrator lens results in a beam projected on the center of the respective solar cells in a continuous manner as the sun traverses the sky during the day, thereby optimizing the amount of sunlight impinging upon the cells.

As described below, the solar tracking mechanism optimally predicts the location of the sun at a future time, and orients the array such that it aligns with the sun at that future time. Performing this process repeatedly yields the advantageous result that the array remains substantially aligned with the sun's rays. One aspect of this approach is that it involves not only predicting where the sun will be, but predicting how to operate one or more motors (or actuators) to orient to array to meet the sun's rays at that future time. In some implementations, the solar tracking system employs a kinematic model of the array that correlates movement of the one or more motors with the movement of the solar panel.

Solar Tracking

FIGS. 1A, 1B, 1C and 1D are an illustration of a solar cell array 105 tracking the sun 102 during different times of the day. The Figures are oriented on the page so that the north direction is out of the page, south is into the page, east is to the left of the page, and west is to the right of the page. The solar cell array 105 includes a central support (11a, 11b) that is fixed to a base 101. The base 101 can be, for example, a concrete foundation on a surface of the earth. The solar cell array 105 also includes a solar panel 10. The solar panel 10 is mounted to the central support (11a, 11b) by way of a jackscrew 111, threaded rod 112 and pivot point (e.g., a hinge) 104. The solar panel includes a generally rectangular array of solar cell receivers (e.g., each receiver including a Fresnel lens and a triple junction III-V compound semiconductor solar cell).

As shown, the panel 10 is kept orthogonal to the rays of the sun 102 as the sun 102 traverses across the sky. This is accomplished by rotating the panel about two substantially perpendicular axes to account for the sun's elevation and azimuth. To adjust for the sun's azimuth, an azimuth motor causes the panel 10 to rotate about axis 103 (i.e., the longitudinal axis of the central support 11a, 11b). To adjust for the sun's elevation, an elevation motor causes the translation of the threaded rod 112 in the jackscrew 111. Because the panel 10 is coupled to the central support (11a, 11b) by a hinge 104, translation of the threaded rod 112 adjusts the angle of the panel 10 (i.e., the panel 10 rotates about the hinge 104). The angle "α" (alpha) shown in FIG. 1A is the "jack angle" which is used by the software in an embodiment of the present invention.

Figure 2:
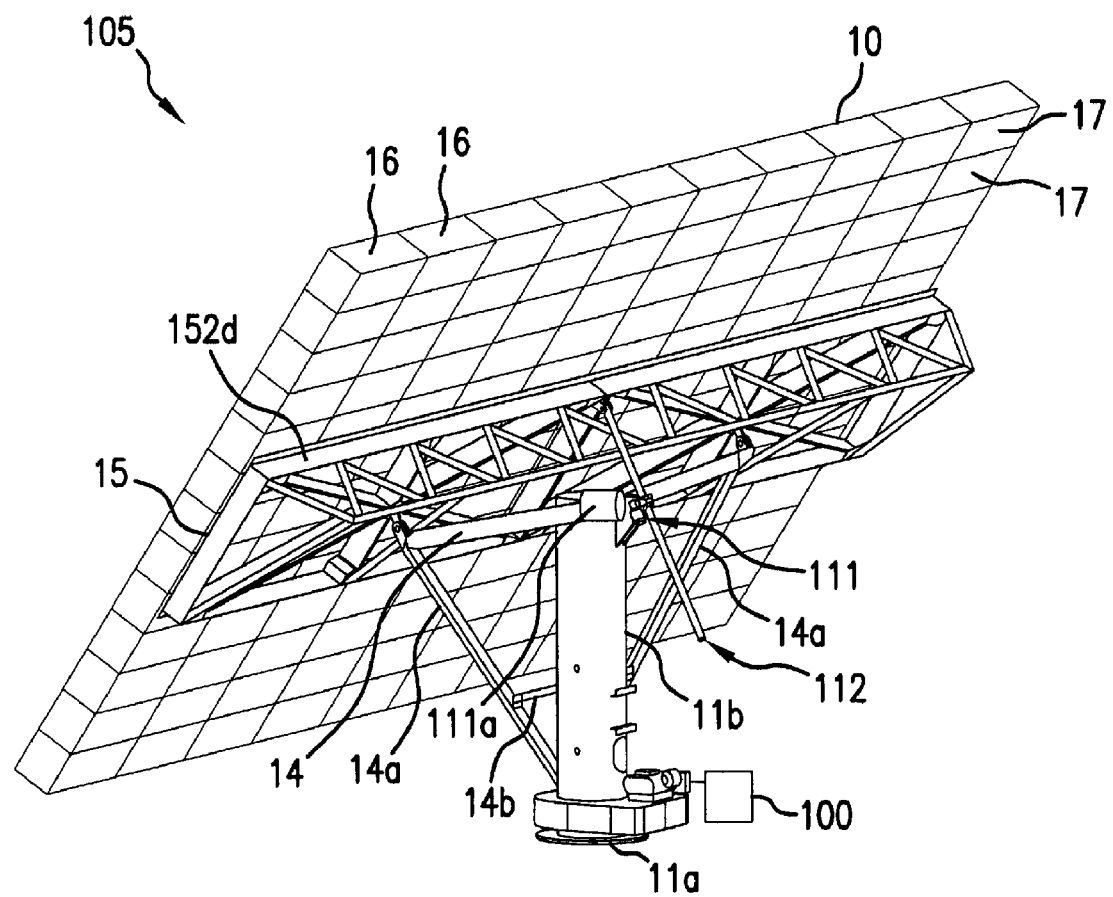
FIG. 2 illustrates further details of an example of a solar cell array.

FIG. 2 illustrates a terrestrial solar cell array 105 in greater detail. The solar cell array of FIG. 2 is described in co-owned U.S. patent application Ser. No. 12/131,556, filed Jun. 2, 2008, hereby incorporated herein by reference. In general terms, the array comprises three major components. The first major component is the central support (11a and 11b). The central support is mounted to a surface (e.g., item 101 of FIG. 1A) and is capable of rotating about its longitudinal axis. Depending on the implementation, the surface can be, e.g., the ground or a concrete foundation formed in the ground. Disposed on or adjacent to the surface is a drive mechanism 100 (e.g., azimuth motor 210 of FIG. 2) that couples to the central support. The drive mechanism 100 enables the inner member 11b to rotate relative to the outer member 11a, e.g., for moving the solar cell array such that it tracks the azimuth of the sun. The drive mechanism can include a motor along with one or more gears.

The second major component is the support frame 15. The support frame 15 couples to the central support and is adapted to support a solar panel (e.g., panel 10). The third major component is the solar panel 10. The solar panel 10 includes multiple sub arrays 16 and is coupled to, and supported by, the support frame 15. The solar panel converts sunlight into electricity, and normally is kept facing the sunlight by the rotation of the central support and adjustment of the jackscrew and threaded rod (111 and 112). In this implementation, each of the solar cell subarrays 16 is divided into thirteen sections 17. Each section 17 includes a 2×7 panel of concentrating lenses each lens disposed over a single receiver. The receiver, a printed circuit or subassembly, includes a single III-V compound semiconductor solar cell together with additional circuitry such as a bypass diode (not shown). In some implementations, each section 17 is a module, e.g., a discrete assembly.

In the illustrated implementation, the central support includes an outer member 11a and an inner member 11b. The outer member 11a is connectable to a support mounted on the surface by bolts. The inner member 11b is rotatably mounted within the member 11a and supports a cross member 14 which is connected to a support frame 15. The support frame 15 also is supported on the inner member 11b by a pair of inclined arms 14a which extend respectively from the support frame 15 to the base of the inner member 11b. The inclined arms 14a are coupled to each other by a cross-member 14b that increases their structural integrity. The mounting of the support frame 15 in this manner ensures that it is fixed to the inner member 11b of the central support in such a manner that it is rotatable about its central longitudinal axis through members 11a and 11b.

Jackscrew 111 and mating threaded rod 112 together can adjust the angle of the panel 10 to track the elevation of the sun. Thus, the jackscrew 111 in combination with a drive mechanism 111a (e.g., elevation motor 211 of FIG. 2) enables pivoting the support frame 15 about hinge 104, and thus the panel 10, so as to adjust its angle with respect to the earth's surface.

Figure 3:
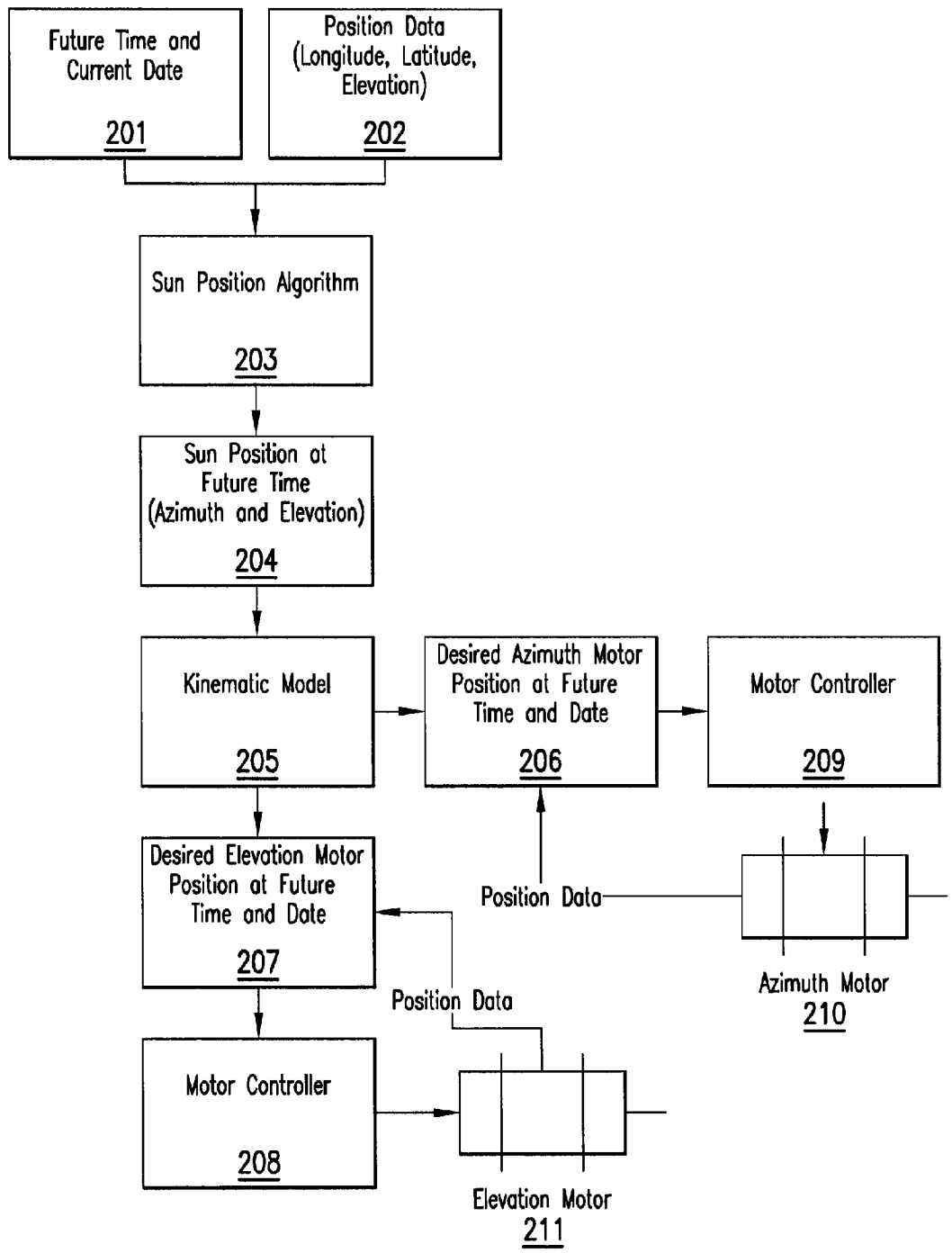
FIG. 3 is a block diagram of an implementation of a terrestrial solar tracking system.

FIG. 3 is a block diagram of an implementation of a terrestrial solar tracking system. The system receives as input data (a) the date and a future time (201) and (b) position data of the array (202), including, e.g., longitude, latitude and elevation above sea level. In this implementation, the system utilizes a future time (201) rather than the current time so that rather than lagging behind the sun, the array can be oriented to align with the sun at its expected position at the future time. In some implementations, the future time is one minute into the future. In some implementations, the future time can be sunrise, so that upon sunrise, the solar panel is aligned with the sun. To maintain alignment, the system can repeat its alignment calculation periodically (e.g., every minute) or continuously.

Based on at least the input data (201, 202), the sun position algorithm (203) calculates the position of the sun (e.g., its azimuth and elevation) at that future time (204). In some implementations, the sun position algorithm (203) includes the Solar Position Algorithm (SPA) available from the National Renewable Energy Laboratory (see http://rredc.nrel.gov/solar/codesandalgorithms/spa/and http://www.nrel.gov/docs/fy08osti/34302.pdf, both of which are incorporated herein by reference).

The sun's azimuth and elevation at the future time (204) are input data to the kinematic model (205). The kinematic model (see FIG. 5) correlates movement of the azimuth motor (210) and the elevation motor (211) with movement of the solar panel (10). As such, the kinematic model (205) facilitates calculation of the appropriate actuation of the azimuth motor (206) and the elevation motor (207) so that the array (10) is aligned with the sun's elevation and azimuth at the future time (204). Each of the motors (210, 211) includes a position encoder that determines the current position of each respective motor (e.g., measured by the rotational position of the drive shaft, represented as an integral number of "counts" or increments of a predetermined numbers of degrees, starting from zero and continuing through 360 degrees for one turn, 720 degrees for two turns, etc.). For control purposes, the position data is fed back to the motor position calculation (206, 207).

Figure 1B:
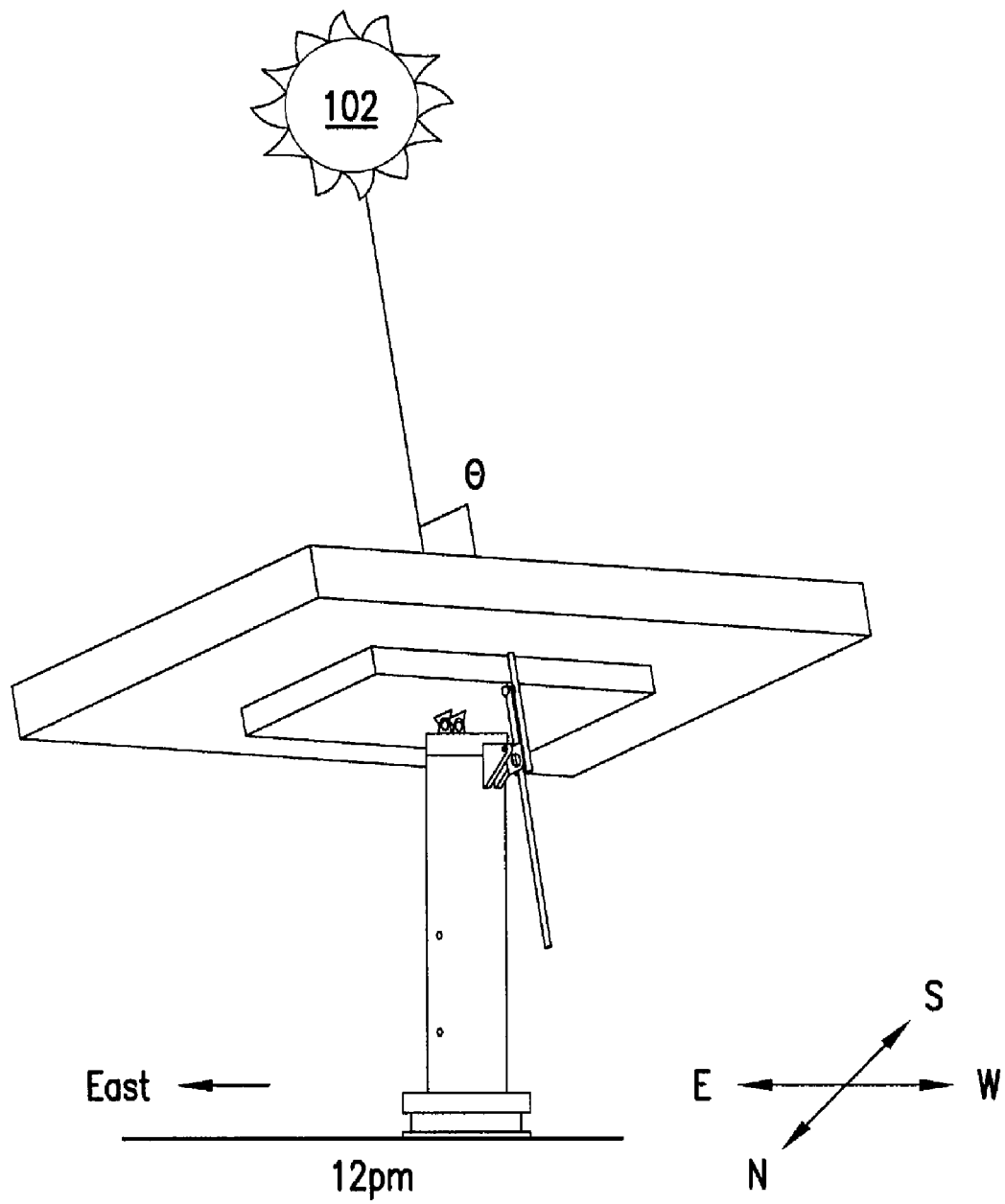
Figure 1C:
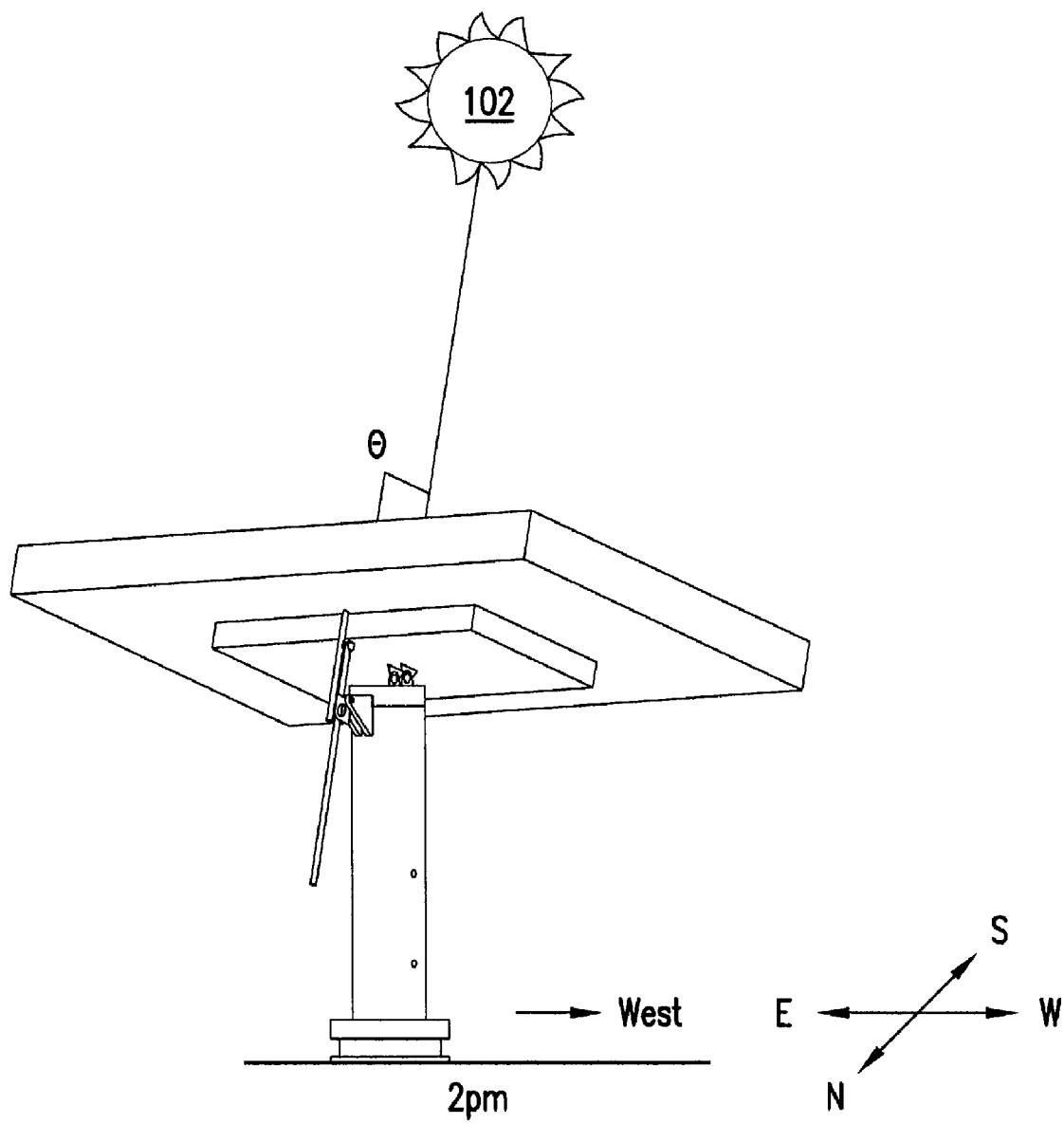
Figure 1D:
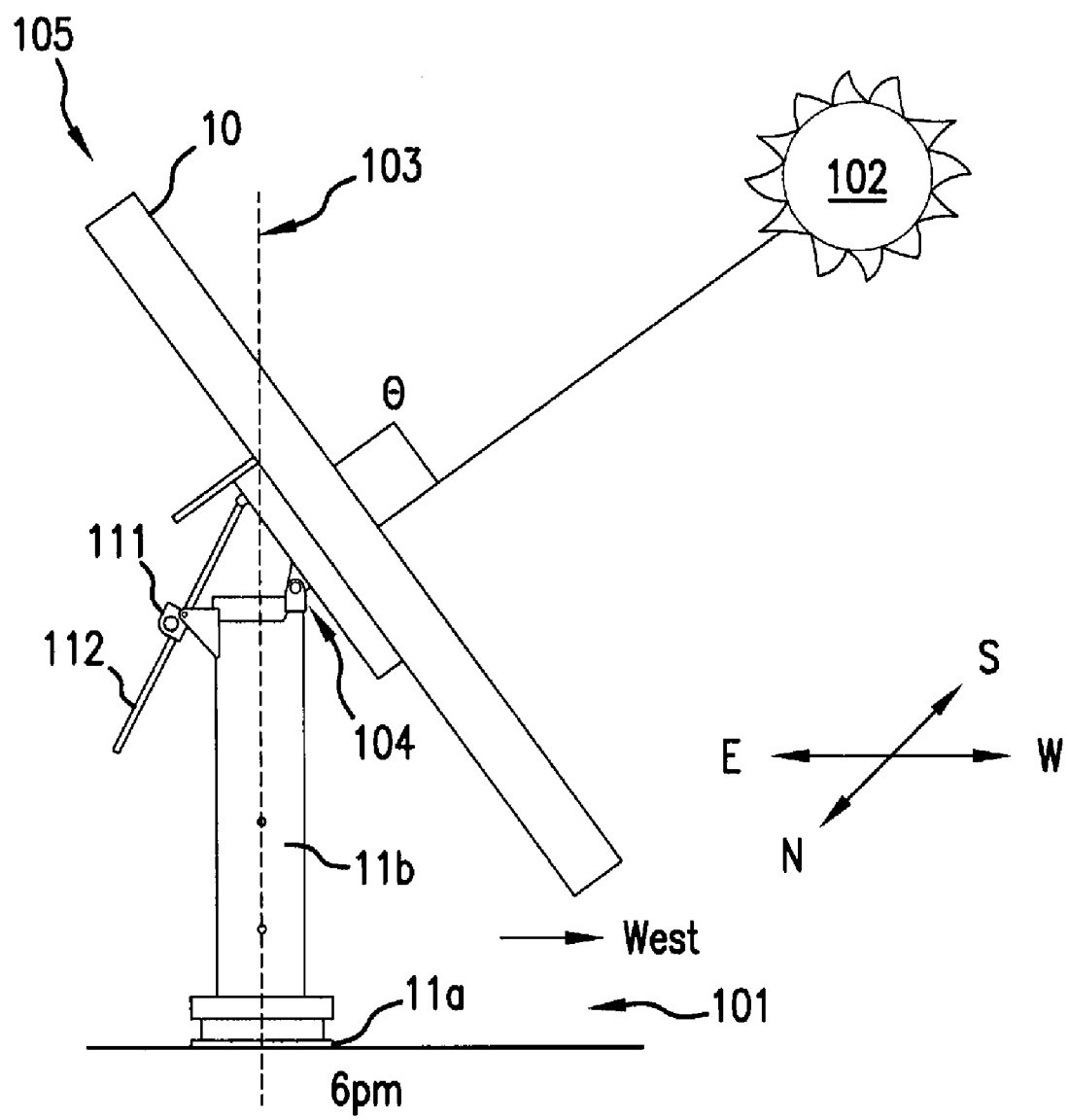

Motor controllers (208, 209) allow the low-power logic signals based on the algorithms to control the relatively high-power circuits of the motors (210, 211). With respect to FIG. 2, the azimuth motor 210 would be arranged to cause rotation of the panel about axis 103. The elevation motor 211 would be coupled to the jackscrew 111 and threaded rod 112 so as to adjust the angle of the panel 10 (i.e., rotate the panel 10 about the hinge 104). Examples of azimuth and elevation motors are illustrated in FIG. 1B (items 100 and 111a, respectively).

The data of blocks 201-207 can be stored in one or more data stores (e.g., magnetic media, solid state media, or other suitable memory structure). The processing of, e.g., blocks 203 and 205-209 can be performed by, e.g., one or more microprocessors or special or general purpose computers.

Figure 4:
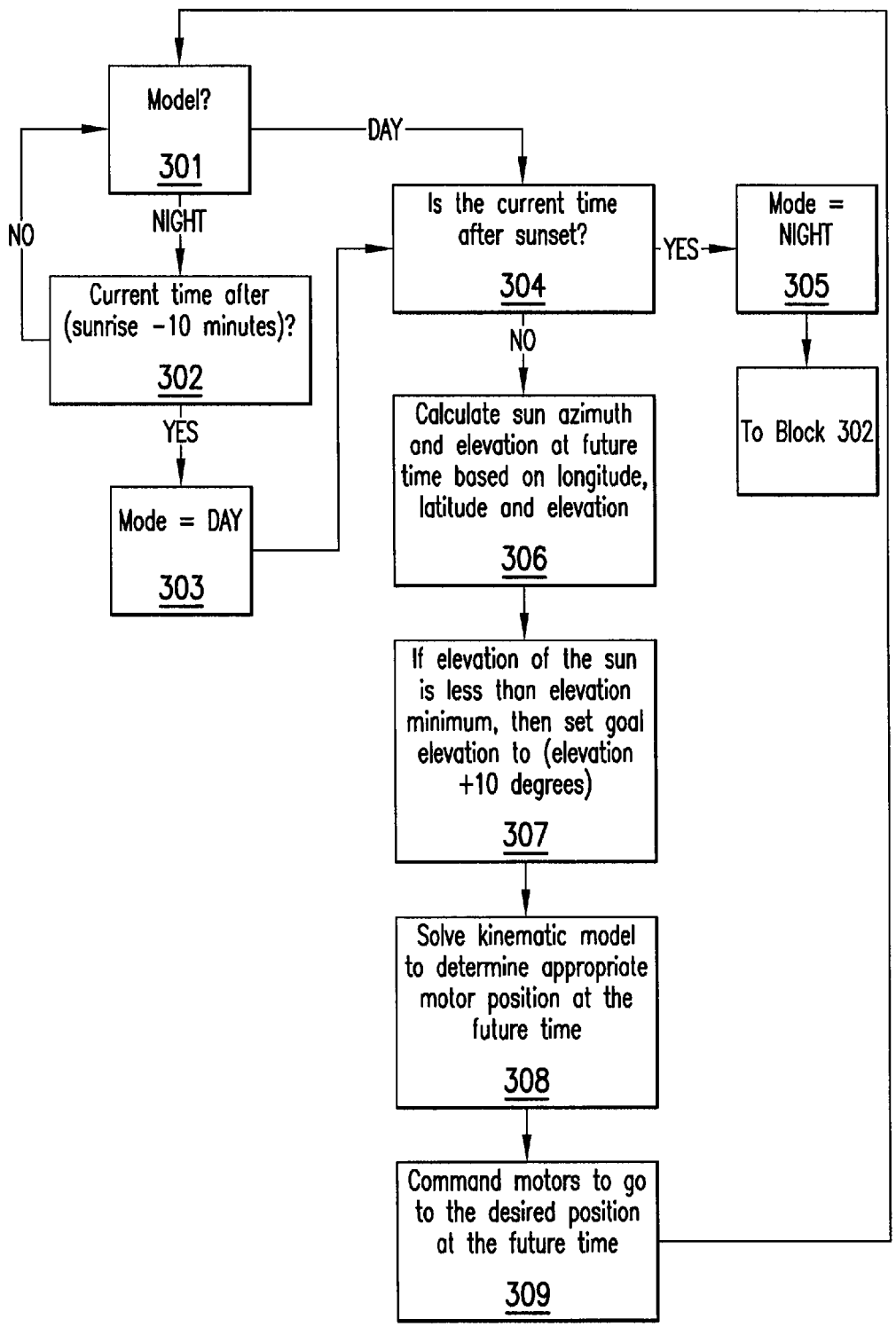
FIG. 4 is a flow chart of terrestrial solar tracking.

FIG. 4 illustrates an implementation of a method for terrestrial solar tracking. First, the mode is determined (301). If it is night mode, it is determined whether the current time is after 10 minutes before sunrise (302). If not, the mode remains night, and step 302 is repeated until a mode change occurs. Night mode, in some implementations, orients the solar panel 10 in a manner that minimizes damage from weather or other hazards.

If the current time is after 10 minutes before sunrise, the mode is set to day (303). But if it is also determined that the current time is after sunset (304), the mode is set to night (305). If the current time is not after sunset, the sun's azimuth and elevation at the future time are calculated using the sun position algorithm (306). The future time can vary with the implementation, but in some implementations, the future time is one minute into the future. On some occasions, the future time is sunrise.

The array may be "parked" overnight in a position pointing away from the night sky or sun, to protect it from weather or other environmental conditions when it is not in use. The "start up" position is not necessarily pointing towards the horizon at sunrise. A start up position may be set at, for example, 5 degrees above the horizon. If mountains are on the horizon, the angle may even be greater. In any event, in the preferred embodiment, at some time after sunrise the tracking process may be initiated. The array is moved from a rest position (which may, for example be 15 degrees above the horizon), to the position of the sun at a predetermined start time (i.e. a predetermined "future" time). The tracking process then follows the sun as it moves from the start position during the course of the day.

Using the sun's elevation and the azimuth, the kinematic model is used to determine the appropriate position of the azimuth and elevation motors (e.g., the rotational position of the drive shafts) to orient the solar cell array such that it is aligned with the sun at the future time (308). The elevation and azimuth motors are then commanded to the appropriate positions at the future time (309). In some implementations, block 309 includes precisely controlling the speed of the motors such that, at the future time, the solar panel is aligned with the sun's position at the future time. In some implementations, the motors are operated so that the solar cell array smoothly translates to the appropriate position.

Figure 5:
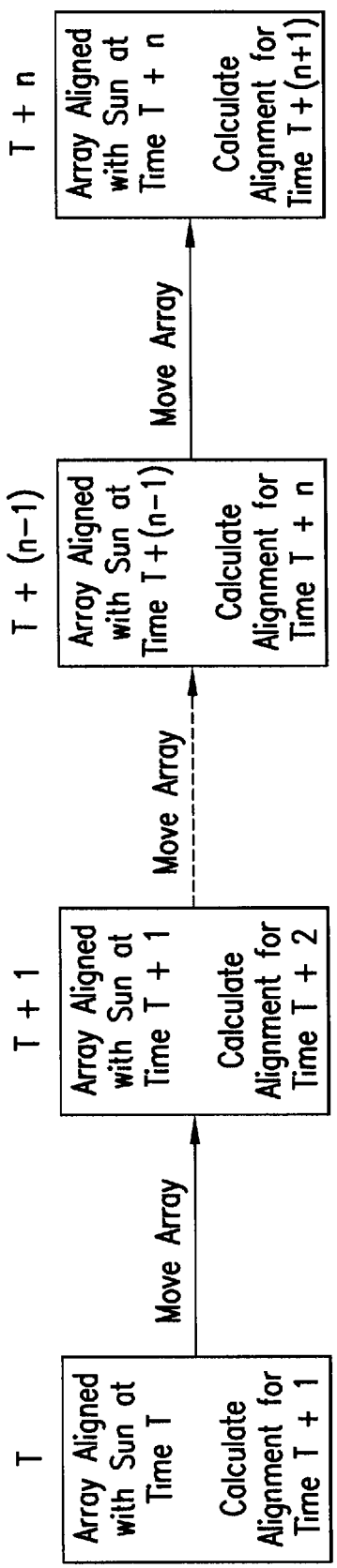
FIG. 5 is a block diagram illustrating solar tracking as a function of time.

FIG. 5 illustrates solar tracking as a function of time. As described, the solar tracking system predicts the position of the sun at a future time (e.g., one minute into the future) and begins moving the solar cell array so that when then future time arrives, the solar cell array is aligned with the sun's future position. The calculating and moving can be done continuously (e.g., such that the sun's future position is continuously being calculated and the solar cell array is continuously moving) or can be done periodically or intermittently (e.g., every minute, the sun's future position is calculated and the solar cell array is moved).

Thus, at time T, the solar cell array is aligned with the sun's position at time T. At the same time, the position of the sun at a future time T+1, (e.g., one minute into the future) is calculated, as well as the manner of actuating the azimuth and elevation motors based on the kinematic model so that the solar cell array aligns with the sun's position at time T+1. Between T and T+1, the solar cell array is moved such that at time T+1, the solar cell array is aligned with the sun's position at time T+1. Likewise, at time T+1, the position of the sun at a future time T+2 is calculated, as well as the manner of actuating the azimuth and elevation motors based on the kinematic model so that the solar cell array aligns with the sun's position at time T+2. The process continues such that at T+n (i.e., an arbitrary time in the future), the solar cell array is aligned with the sun at its position at time T+n, and the position of the sun at a future time T+(n+1) is calculated, as well as the manner of actuating the azimuth and elevation motors based on the kinematic model so that the solar cell array aligns with the sun's position at time T+(n+1).

Figure 6:
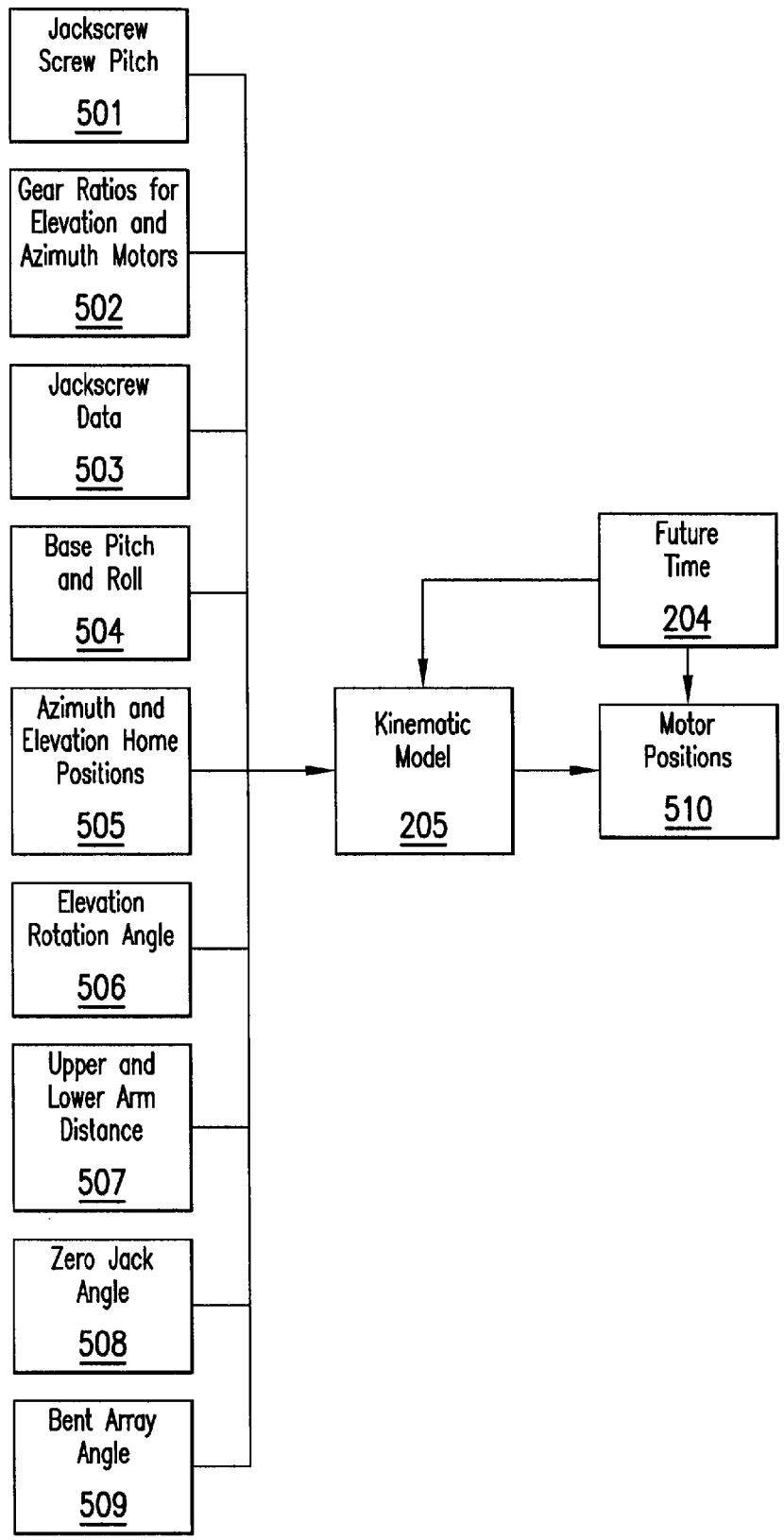
FIG. 6 is a block diagram of an implementation of a kinematic model for a terrestrial solar cell array.

FIG. 6 illustrates an implementation of the kinematic model 205. As discussed, the kinematic model 205 correlates movement of the azimuth and elevation motors with the movement of the solar panel. Therefore, if the desired position of the solar panel is known (e.g., vis-à-vis the position of the sun at a given time), the kinematic model 205 can derive how the motors should be actuated to move the solar cell array to the desired position (e.g., move the azimuth motor driveshaft 0.5 degrees and move the elevation motor driveshaft 2 degrees).

To perform the correlation function, the kinematic model 205 receives several parameters as input data. Some examples are shown in FIG. 6 as blocks 501-509. Generally speaking, while more parameters can provide a more accurate kinematic model, all of blocks 501-509 are not required to achieve a functional kinematic model. In fact, since the kinematic model 205 can be tailored for a particular array, entirely different parameters can be used in some implementations. For example, this example presumes that the solar cell array uses geared elevation and axis motors and a jackscrew. Some solar cell arrays can use direct drive and another means for adjusting the angle of the array. Therefore, the parameters are advantageously chosen based on the configuration of the particular array.

Some parameters are directed to the particular mechanical characteristics of the solar cell array. The kinematic model 205, in this implementation, receives the pitch of is the threaded rod (e.g., item 112 of FIG. 2). This parameter 501 is informative to the model 205 because depending on the thread pitch, the more or less rotation will be required to accomplish a given linear translation (e.g., a finer thread pitch requires more rotation to accomplish the same linear translation than a coarser thread pitch). The gear ratios (502) are informative for the same reason—they are related to how much the motor driveshafts must rotate to accomplish a given amount of translation of the solar panel. The jackscrew data (503) includes information about the jackscrew, such as length and position of the rod, and the angle between the solar panel and the threaded rod. This parameter 503 affects how much of the linear translation of the threaded rod (112) is translated into adjusting the angle of the solar panel. For example, if the angle between the solar panel and the threaded rod is about ninety degrees, substantially all of the linear motion of the threaded rod is translated into adjusting the tilt of the solar panel. Moreover, since the angle of the threaded rod can change as it translates, a trigonometric model can be used to continuously update this parameter (i.e., 503 can be a dynamic parameter). Azimuth and elevation motor home positions (505) are the positions that the controllers for azimuth and elevation motors, respectively, regard as their home positions. The elevation home position can also be specified by the length of the threaded rod when the elevation motor is in its home position. Although such data may optionally also be included in the 503 data, the upper and lower arm distance parameter (507) is herein called out separately and relates to the distance between the top of the threaded rod (e.g., 112) of the jackscrew (e.g., 111) and the elevation hinge about which the solar panel rotates (e.g., hinge 104) and the distance between bottom of the threaded rod and the elevation hinge. This parameter 507 duplicates or is related to the jackscrew data parameters (503) in the sense that it also pertains to the geometry of the elevation adjustment and how translation of the threaded rod translates into changing the elevation angle. The zero jack angle parameter (508) is the elevation angle of the solar panel when the jackscrew angle is zero. The foregoing parameters can also affect the speed at which the motors are operated. For example, a finer thread pitch for the jackscrew (parameter 501) means that the elevation motor must rotate faster to accomplish a given change in elevation in a given time period as compared to a coarser thread pitch. As another example, a similar concept applies to the motor gear ratios (parameter 502).

Some parameters are directed to compensating for imperfections in the solar cell array installation and construction. For example, parameter 504 is directed to the base (e.g., item 101 of FIG. 1A) pitch and roll. The base might not be perfectly level, and therefore, as the solar panel translates in one direction, an errant translation also can occur in a second direction. Parameter 504 allows the kinematic model 205 to account for such errors. Also, in theory, the elevation axis (e.g., about hinge 104) is perpendicular to the azimuth axis (e.g., axis 103). However, variances in construction and/or assembly may result in the elevation and azimuth axes being non-perpendicular. Parameter 506 allows the model 205 to account for such an error. Also, in theory, the plane of the solar panel is perpendicular to the elevation hinge (e.g., hinge 104). Variances in construction and/or assembly may result in that not being the case. Parameter 509 allows the model 205 to account for such an error.

The kinematic model 205 receives parameters 501-509 and the sun's position at the future time (204). With that input data, the kinematic model 205 determines how the motors should be actuated (510) to align the solar panel with the sun at the future time. The future time (204) data is further utilized to specify the motor positions (510).

The data of blocks 501-509 can be stored in one or more data stores (e.g., magnetic media, solid state media, or other suitable memory structure). The processing of, e.g., blocks 503 and 205 can be performed by, e.g., one or more microprocessors or special or general purpose computers.

Embodiments of the subject matter and the functional operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer program products, i.e., one or more modules of computer program instructions encoded on a computer readable medium for execution by, or to control the operation of, data processing apparatus. The computer readable medium can be a machine-readable storage device, a machine-readable storage substrate, a memory device, or a combination of one or more of them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, a runtime environment or a combination of one or more of them. A propagated signal is an artificially generated signal, e.g., a machine-generated electrical, optical, or electromagnetic signal, that is generated to encode information for transmission to suitable receiver apparatus.

A computer program (also known as a program, software, software application, script, or code) can be written in any form of programming language, including compiled or interpreted languages, and it can be deployed in any form, including as a stand alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device. Computer readable media suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

While operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous.

A number of implementations have been described. Nevertheless, it will be understood that various modifications may be made without departing from the spirit and scope of the invention. Accordingly, other embodiments are within the scope of the claims.

What is claimed is:

1. An automated method of tracking the sun with a photovoltaic solar cell array of a terrestrial solar cell system, the photovoltaic solar cell array being at a first position at a first time of a day and comprising a first drive element and a second drive element that are respectively controllable to adjust the position of the photovoltaic solar cell array along respective different axes, the method comprising:
    receiving an input comprising a second time of the day at which tracking of the sun should begin, and the first position of the photovoltaic solar cell array, the first time being before the second time;
    predicting, with a computer algorithm, a position of the sun at the second time based at least in part upon the second time of the day;
    determining, with a kinematic model, respective actuations of the first and second drive elements that will re-position the photovoltaic solar cell array from the first position to a second position at which the photovoltaic solar cell array will be substantially aligned with the sun at the second time to begin tracking the sun, the kinematic model relating respective actuations of the first and second drive elements with movement of the photovoltaic solar cell array;
    at the first time, before the second time, beginning actuation of respective first and second drive elements based at least in part upon the kinematic model determination to re-position the photovoltaic solar cell array from the first position to the second position such that the photovoltaic solar cell array is substantially aligned with the sun at the second time when the photovoltaic solar cell array begins tracking the sun; and
    predicting respective positions of the sun at other times during the day and re-positioning the photovoltaic solar cell array according to respective kinematic model determinations such that the photovoltaic solar cell array is substantially aligned with the sun at other times during the day.

2. The method of claim 1, the photovoltaic solar cell array moving substantially continuously to maintain substantial alignment with the sun throughout the day.

3. The method of claim 1, the photovoltaic solar cell array moving periodically to maintain substantial alignment with the sun throughout the day.

4. The method of claim 1, the second time comprising a time after sunrise, the predicted position of the sun at the second time comprising a position of the sun above the horizon after sunrise.

5. The method of claim 1, at the first time, the photovoltaic solar cell array being in a rest or parked position in which the photovoltaic solar cell array points away from a location of the sun at sunrise, and respective first and second drive elements being respectively actuated at the first time before sunrise to begin re-positioning of the photovoltaic solar cell array such that the photovoltaic solar cell array is substantially aligned with the sun at the second time after sunrise.

6. The method of claim 1, at the first time, the photovoltaic solar cell array being in a rest or parked position in which the photovoltaic solar cell array points away from a location of the sun at sunrise, and respective first and second drive elements being respectively actuated at the first time after sunrise to begin re-positioning of the photovoltaic solar cell array such that the photovoltaic solar cell array is substantially aligned with the sun at the second time after sunrise.

7. The method of claim 1, the photovoltaic solar cell array being substantially aligned with the sun when a focused beam of sunlight is incident upon respective centers of respective solar cells of the photovoltaic solar cell array.

8. The method of claim 1, the first and second drive elements being respectively actuated to re-position the photovoltaic solar cell array in a smooth, substantially continuous manner.

9. The method of claim 1, the kinematic model determining that the first and second motors should be actuated by different amounts or degrees to re-position the photovoltaic solar cell array according to the kinematic model.

10. The method of claim 1, the kinematic model compensating for an error resulting from misalignment of the photovoltaic solar cell array, wherein the uncompensated error would result in the kinematic model determination causing the first and second drive elements to be actuated to re-position the photovoltaic solar cell array to be substantially aligned with a position of the sun at the second time as determined by the computer algorithm that differs from an actual position of the sun.

11. The method of claim 10, the misalignment resulting from installation or construction of the photovoltaic solar cell array.

12. The method of claim 1, the photovoltaic solar cell array comprising a module of concentrator lenses positioned over respective solar cell receivers, sunlight being incident upon the a concentrator lens is focused on a corresponding solar cell receiver, and respective first and second drive elements are actuated such that incident sunlight is substantially orthogonal to respective lenses to substantially align the photovoltaic solar cell array with the sun.

13. The method of claim 1, sunlight being incident upon III-V compound semiconductor solar cells of the photovoltaic solar cell array.

14. The method of claim 1, the first drive element being actuated according to the kinematic model to adjust for an azimuth of the sun, and the second drive element being actuated according to the kinematic model to adjust for an elevation of the sun.

15. The method of claim 1, the photovoltaic solar cell array being supported by a central support member that extends between the photovoltaic solar cell array and a base on a surface of the earth, actuating the first drive element resulting in rotation of the solar cell array about an axis defined by the central support member.

16. The method of claim 1, actuating the first drive element resulting in rotation of at least one gear that causes rotation of the photovoltaic solar cell array about an axis, and actuating the second drive element resulting in rotation of at least one gear that causes linear translation of the photovoltaic solar cell array.

17. The method of claim 16, the second drive element being actuated to drive at least one gear to rotate a threaded member and linearly translate the photovoltaic cell array.

18. The method of claim 17, the threaded member comprising a jackscrew.

19. The method of claim 1, further comprising selecting the second time.

20. The method of claim 1, the input being received at a computing apparatus associated with the terrestrial solar cell system and that hosts the computer algorithm and the kinematic model.

\* \* \* \* \*